United States Patent
Chen et al.

(10) Patent No.: US 9,684,216 B2
(45) Date of Patent: Jun. 20, 2017

(54) PIXEL STRUCTURE AND FABRICATION METHOD THEREOF

(75) Inventors: Chien-Han Chen, Tainan (TW);
Chih-Cheng Wang, Tainan (TW);
Shih-Fang Chen, Hsinchu (TW)

(73) Assignee: E INK HOLDINGS INC., Hsinchu (TW)

(*) Notice: Subject to any disclaimer, the term of this patent is extended or adjusted under 35 U.S.C. 154(b) by 0 days.

(21) Appl. No.: 13/615,641

(22) Filed: Sep. 14, 2012

(65) Prior Publication Data
US 2014/0014944 A1 Jan. 16, 2014

(30) Foreign Application Priority Data
Jul. 16, 2012 (TW) .............................. 101125547 A

(51) Int. Cl.
G02F 1/1368 (2006.01)
H01L 27/12 (2006.01)
G02F 1/1343 (2006.01)

(52) U.S. Cl.
CPC ...... *G02F 1/1368* (2013.01); *G02F 1/134363* (2013.01); *H01L 27/124* (2013.01); *H01L 27/1225* (2013.01); *G02F 2001/134372* (2013.01)

(58) Field of Classification Search
None
See application file for complete search history.

(56) References Cited

U.S. PATENT DOCUMENTS

| 6,031,589 A * | 2/2000 | Kim ................................. 349/39 |
| 7,701,541 B2 | 4/2010 | Yamazaki et al. |
| 2008/0084364 A1* | 4/2008 | Bae et al. ........................ 345/55 |
| 2008/0169469 A1* | 7/2008 | Kawamura ............. H01L 27/12 257/59 |
| 2009/0140259 A1 | 6/2009 | Yamazaki |

(Continued)

FOREIGN PATENT DOCUMENTS

| CN | 101609832 | 12/2009 |
| CN | 102629585 | 8/2012 |

(Continued)

OTHER PUBLICATIONS

"Office Action of China Counterpart Application," issued on Mar. 17, 2016, p. 1-p. 10.

(Continued)

*Primary Examiner* — Whitney T Moore
*Assistant Examiner* — Scott R Wilson
(74) *Attorney, Agent, or Firm* — Jianq Chyun IP Office

(57) ABSTRACT

A pixel structure includes a first patterned transparent conductive layer, an active layer, an insulating layer and a second patterned transparent conductive layer. The first patterned transparent conductive layer is disposed on a substrate and includes a source, a drain and a pixel electrode connected to the drain. The active layer connects the source and the drain. The insulating layer covers the source, the drain and the active layer. The second patterned transparent conductive layer is disposed on the insulating layer and includes a gate disposed above the active layer and a common electrode disposed above the pixel electrode. A fabrication method of a pixel structure is also provided.

8 Claims, 10 Drawing Sheets

(56) References Cited

U.S. PATENT DOCUMENTS

| | | | | |
|---|---|---|---|---|
| 2009/0174835 A1* | 7/2009 | Lee | G02F 1/1368 349/46 |
| 2009/0237582 A1* | 9/2009 | Kakkad | G02F 1/134363 349/46 |
| 2009/0251628 A1* | 10/2009 | Lin | 349/39 |
| 2009/0309103 A1* | 12/2009 | Yagi | 257/72 |
| 2010/0032666 A1* | 2/2010 | Yamazaki et al. | 257/43 |
| 2010/0244000 A1 | 9/2010 | Tanaka et al. | |
| 2011/0031499 A1* | 2/2011 | Kimura et al. | 257/59 |
| 2011/0062441 A1* | 3/2011 | Yabuta et al. | 257/43 |

FOREIGN PATENT DOCUMENTS

| | | |
|---|---|---|
| JP | H1062816 | 3/1998 |
| TW | 201021208 | 6/2010 |

OTHER PUBLICATIONS

"Office Action of China Counterpart Application", issued on Jul. 30, 2015, p. 1-p. 9.

* cited by examiner

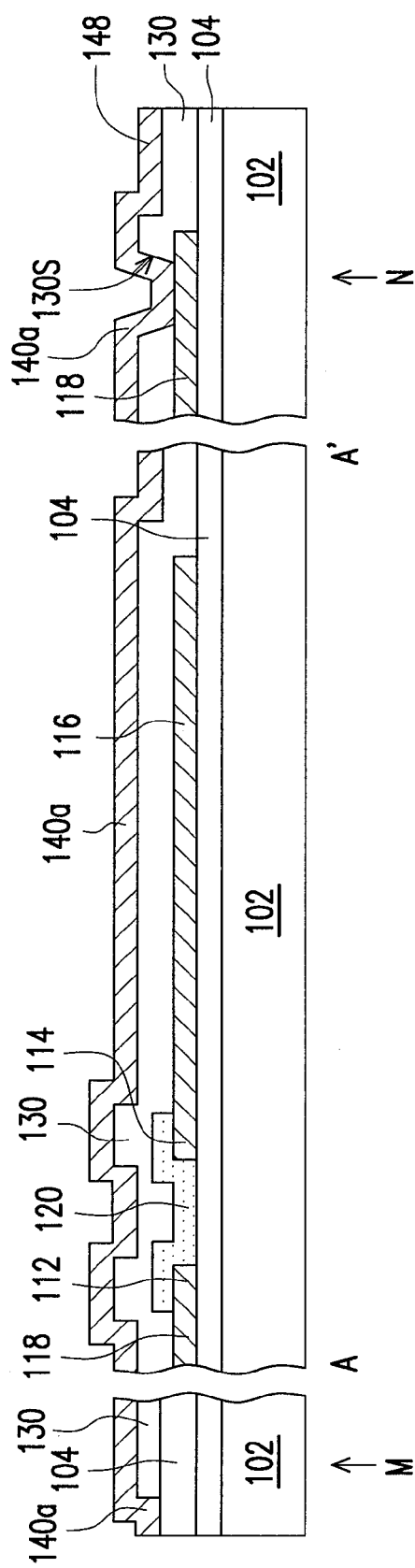
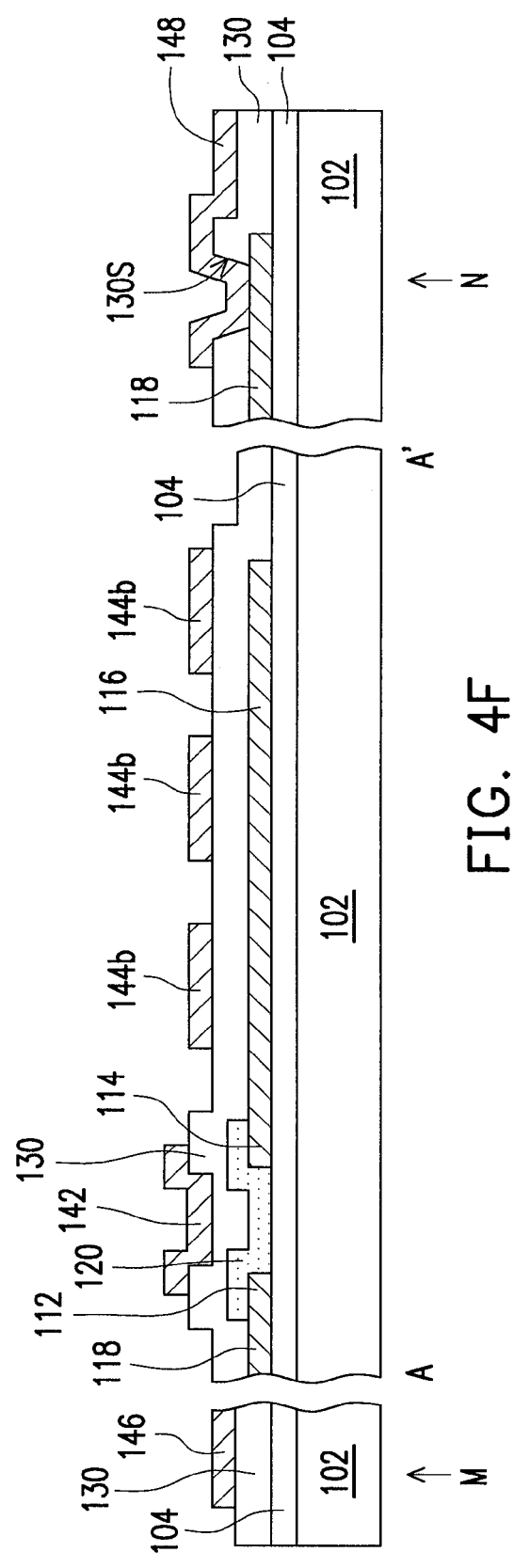

PIXEL STRUCTURE AND FABRICATION METHOD THEREOF

CROSS-REFERENCE TO RELATED APPLICATION

This application claims the priority benefit of Taiwan application serial no. 101125547, filed on Jul. 16, 2012. The entirety of the above-mentioned patent application is hereby incorporated by reference herein and made a part of this specification.

BACKGROUND

Field of the Invention

The invention is directed to an electronic structure and a fabrication method thereof and more particularly, to a pixel structure and a fabrication method thereof.

Description of Related Art

Recently, the advancement of semiconductor devices and display devices flourishingly spreads the development of the multi-media technology. In respect of displays, liquid crystal displays (LCDs) having superior features, such as high definition, compressed space occupation, low power consumption, and free of radiation gradually becomes the mainstream product in the market. To provide better display quality to the liquid crystal display, all kinds of wide viewing angle liquid crystal displays have been developed. The most common ones include, for example, the in-plane switching liquid crystal display (IPS-LCD), the multi-domain vertical alignment liquid crystal display (MVA-LCD), the fringe field switching liquid crystal display (FFS-LCD) and so on.

As for the FFS-LCD, grayscale is produced by an electric field parallel to a substrate and by liquid crystal molecules rotating in a direction parallel to the substrate. The difference between the FFS-LCD and the IPS-LCD lies in different arrangement manners of the electrodes. A pixel electrode and a common electrode in the IPS-LCD are arranged on the same plane, while a pixel electrode and a common electrode in the FFS-LCD are arranged on different planes, wherein one of the pixel electrode and the common electrode has sub-electrodes disposed at intervals, so that the electric field penetrates through the intervals.

However, in the pixel structure of the current FFS-LCD, a bottom-gate type thin film transistor is commonly disposed, which needs six patterning processes to complete the fabrication of the pixel structure.

SUMMARY

The invention is directed to a pixel structure that can effectively achieve cost down.

The invention is directed to a fabrication method of a pixel structure for simultaneously fabricating a gate and a common electrode by using a transparent conductive layer so as to simplify the fabricating process.

According to an embodiment of the invention, a pixel structure including a first patterned transparent conductive layer, an active layer, an insulating layer and a second patterned transparent conductive layer is provided. The first patterned transparent conductive layer is disposed on a substrate and includes a source, a drain and a pixel electrode connected with the drain. The active layer connects the source and the drain. The insulating layer covers the source, the drain and the active layer. The second patterned transparent conductive layer is disposed on the insulating layer and includes a gate disposed above the active layer and a common electrode disposed above the pixel electrode.

According to an embodiment of the invention, a fabrication method of a pixel structure is provided. A first transparent conductive layer is formed on the substrate. The first transparent conductive layer is patterned to form a source, a drain and a pixel electrode connected with the drain. An active layer is formed to connect the source and the drain. An insulating layer is formed to cover the active layer and the pixel electrode. A second transparent conductive layer is formed on the insulating layer. The second transparent conductive layer is patterned to form a gate located above the active layer and a common electrode located above the pixel electrode.

In view of the foregoing, in the pixel structure according to the embodiment of the invention, both the gate and the common electrode are formed by a transparent conductive layer, such that the fabricating process can be simplified, and cost can be reduced. In addition, in the fabrication method of the pixel structure according the embodiment of the invention, the gate and the common electrode can be fabricated by a same patterning process so that an amount of patterning processes used by the pixel structure can be reduced for fabrication cost reduction.

In order to make the aforementioned and other features and advantages of the invention more comprehensible, several embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

FIG. 4A through FIG. 4G are schematic sectional views of FIG. 3A through FIG. 3G along line A-A'.

DESCRIPTION OF EMBODIMENTS

Figure 1:
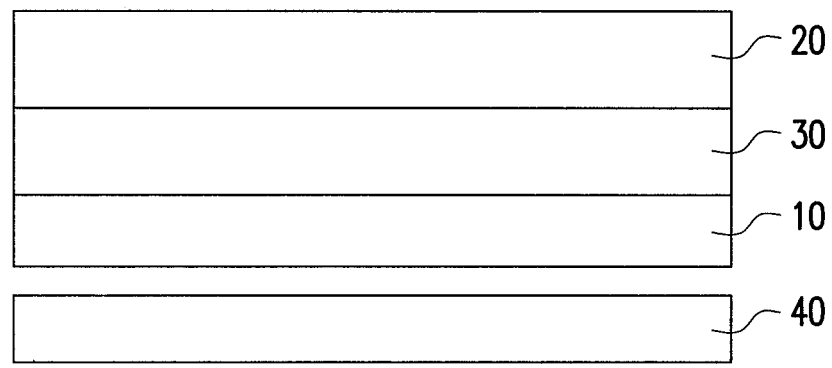
FIG. 1 is a schematic structural view illustrating a liquid crystal display (LCD) according to an embodiment of the invention.

FIG. 1 is a schematic structural view illustrating a liquid crystal display (LCD) according to an embodiment of the invention. Referring to FIG. 1, an LCD 1 of the present embodiment includes an active array substrate 10, an opposite substrate 20, a liquid crystal layer 30 and a backlight module 40. The opposite substrate 20 is disposed opposite to the active array substrate 10. The liquid crystal layer 30 is located between the active array substrate 10 and the opposite substrate 20. The backlight module 40 and the liquid crystal layer 30 are respectively disposed at two opposite sides of the active array substrate 10.

Figure 2:
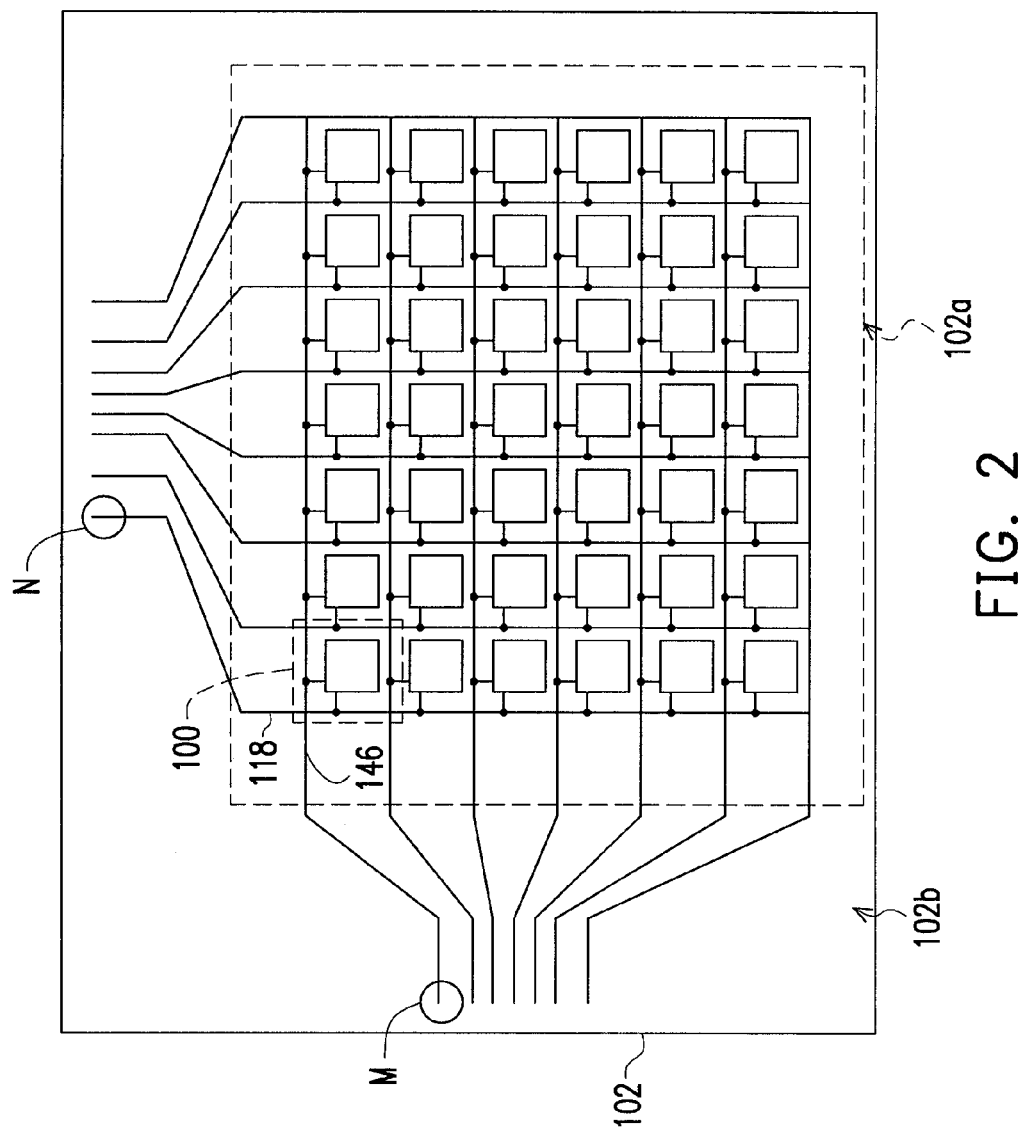
FIG. 2 is a schematic top view illustrating an active array substrate according to an embodiment of the invention.

FIG. 2 is a schematic top view illustrating an active array substrate according to an embodiment of the invention. Referring to FIG. 2, the active array substrate 10 includes a substrate 102, a plurality of data lines 118 and a plurality of scan lines 146. A plurality of pixel structures 100 is defined between the data line 118, the scan line 146, the adjacent data line 118 and the adjacent scan line 146. The substrate has an active area 102a and a circuit area 102b. The circuit area 102b is located at the periphery of the active area 102a. Typically, the pixel structures 100 are disposed in the active area 102a, and wires connected with the pixel structures 100 (the data lines and the scan lines) extend from the active area to the circuit area 102b.

FIG. 3A through FIG. 3G are schematic top views illustrating a fabricating process of a pixel structure according to an embodiment of the invention. FIG. 4A through FIG. 4G are schematic sectional views of FIG. 3A through FIG. 3G along line A-A'. FIG. 4A through FIG. 4G are schematic sectional views further illustrating a portion M and a portion N in the circuit area 102b depicted in FIG. 2.

Figure 4A:
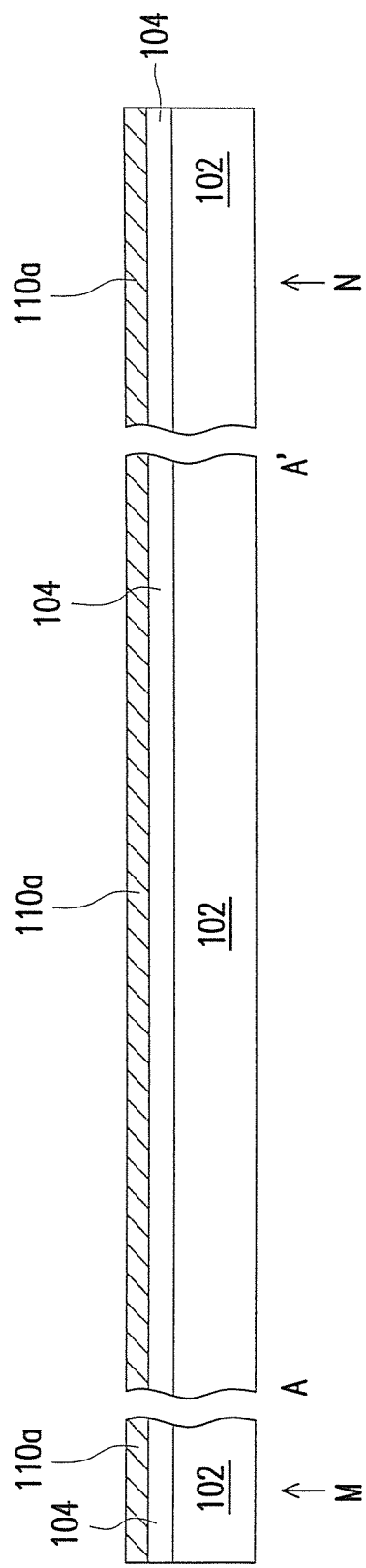

Referring to 3A and FIG. 4A, in the present embodiment, an ultraviolet (UV) blocking layer 104 may be formed on the substrate 102. A material of the ultraviolet blocking layer 104 is, for example, a resin layer, and a material of the resin layer is, for example, silicone resin, acrylic resin or a combination thereof. A method of forming the ultraviolet blocking layer 104 is, for example, coating the unsolidified resin material on the substrate 102 first and then solidifying the resin material to form the ultraviolet blocking layer 104. A method of solidifying the resin material is, for example, a UV-radiation process or a heating process.

Then, a first transparent conductive layer 110a is formed on the substrate 102. In the present embodiment, the first transparent conductive layer 110a is formed on the ultraviolet blocking layer 104.

Figure 3A:
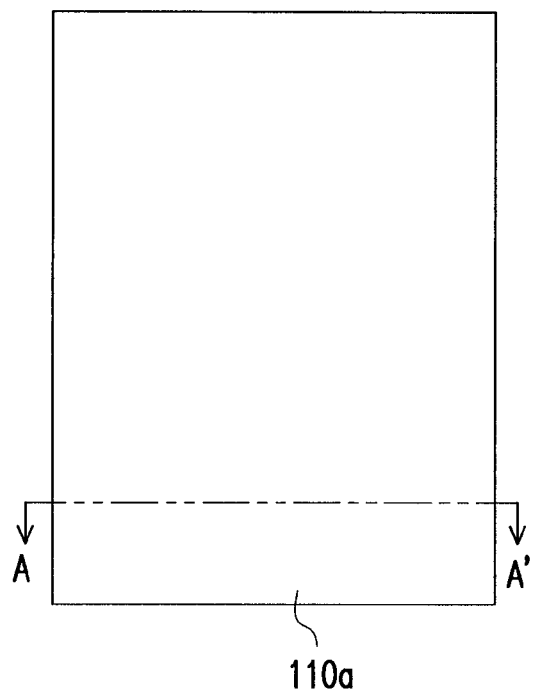
FIG. 3A through FIG. 3G are schematic top views illustrating a fabricating process of a pixel structure according to an embodiment of the invention.
Figure 3B:
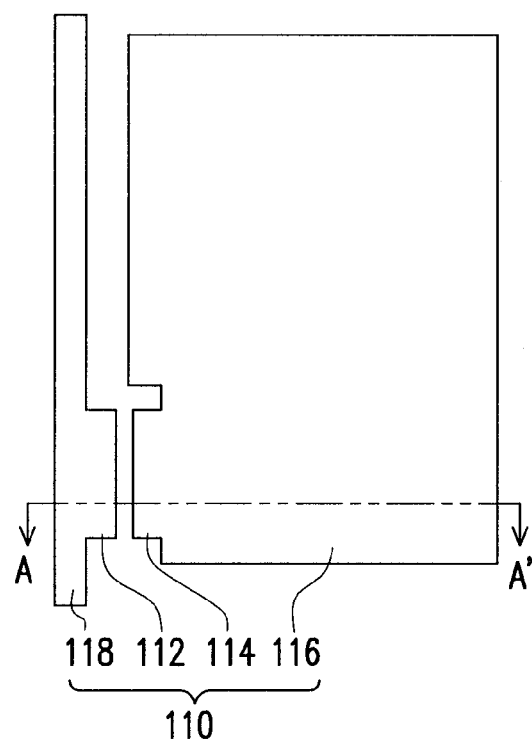
Figure 4B:
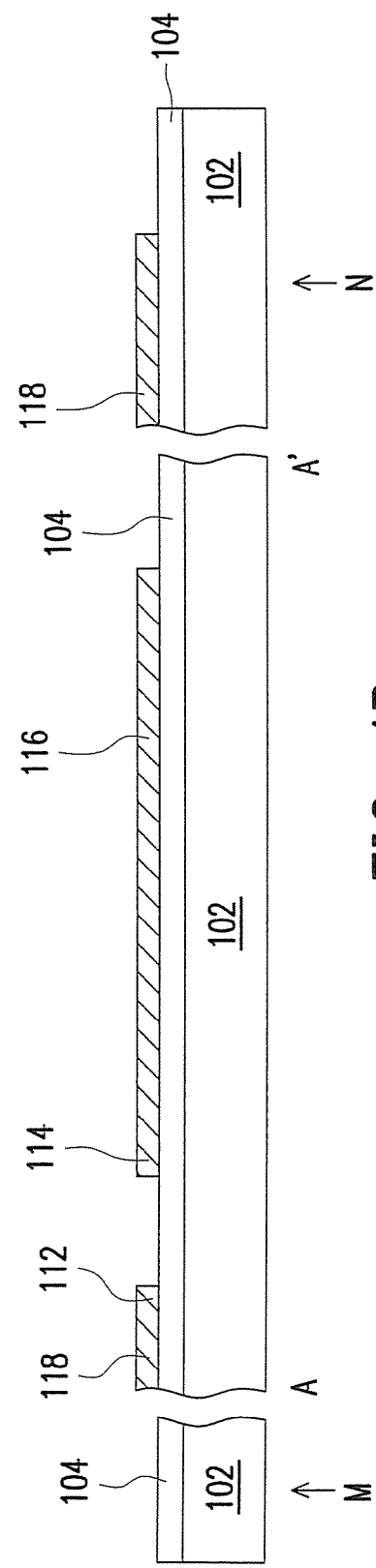

Referring to FIG. 3B and FIG. 4B, a first patterning process is performed on the first transparent conductive layer 110a to form a source 112, a drain 114 and a pixel electrode 116. The pixel electrode 116 is connected with the drain 114. The first patterning process is, for example, a photolithography and etching process (PEP).

In addition, while forming the source 112, the drain 114 and the pixel electrode 116, the data line 118 are also formed. The data line 118 is connected with the source 112. The data line 118 extends to the circuit area 102b. It should be mentioned that the source 112, the drain 114 and the pixel electrode 116 are made of a transparent conductive material, so that transmittance of the pixel structure 100 can be further improved.

Figure 3C:
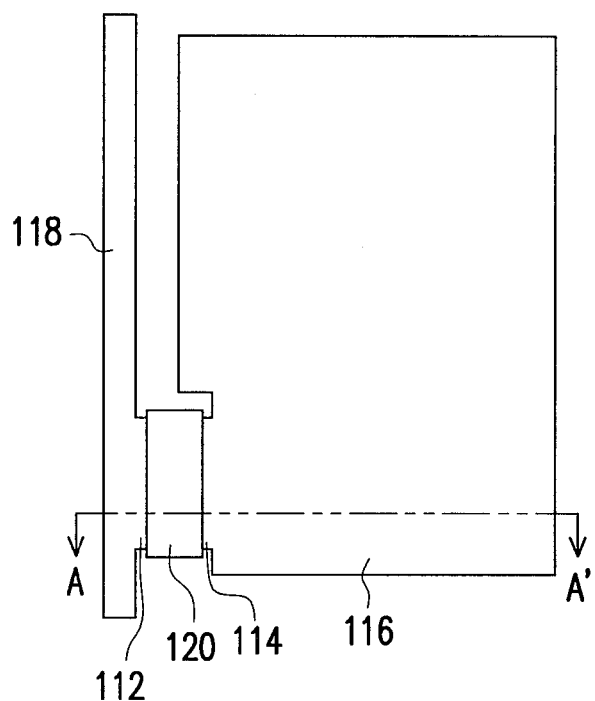
Figure 4C:
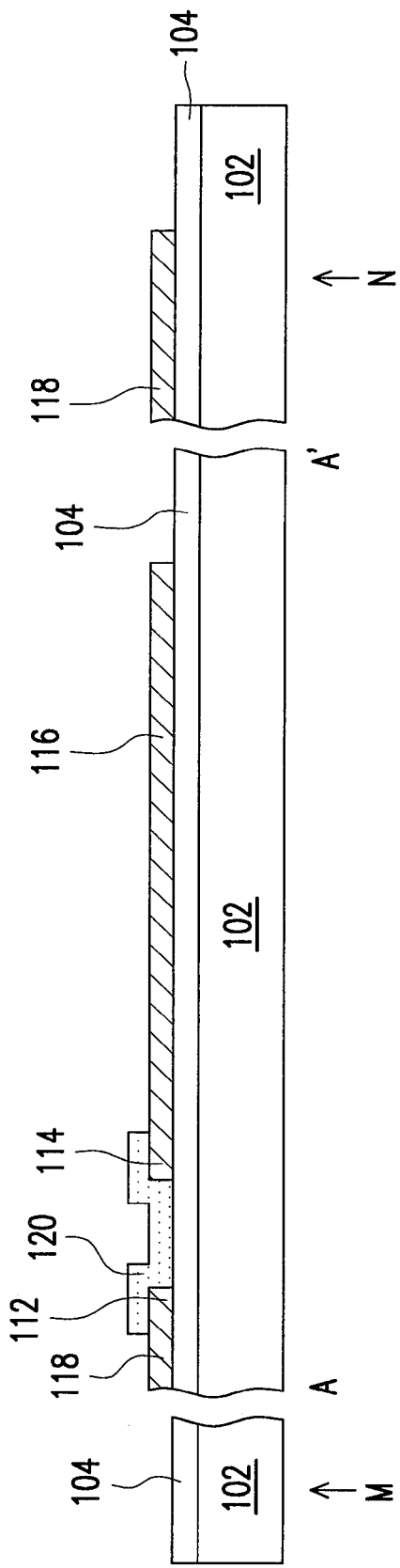

Referring to FIG. 3C and FIG. 4C, an active layer 120 is formed, and the active layer 120 connects the source 112 and the drain 114. In the present embodiment, the active layer 120, for example, covers at least a portion of the source 112 and at least a portion of the drain 114. A material of the active layer includes a metal oxide semiconductor, such as indium-gallium-zinc oxide (IGZO), tin oxide, aluminum oxide (e.g. $Al_2O_3$) or a combination thereof. A second patterning process is, for example, a photolithography and etching process (PEP). For example, the step of forming the active layer 120 is, for example, forming a metal oxide semiconductor material on the substrate 102 first and then, performing an annealing process. Next, processes such as photoresist coating, exposing, developing, etching and photoresist stripping are performed so as to form the active layer 120. It is to be mentioned that the annealing process contributes to improve ion mobility for the active layer 120, and the structure of the active layer 120 becomes robust. Besides, the annealing process can reduce impedance for the first patterned transparent conductive layer 110 and increase transmittance for the first patterned transparent conductive layer 110. Further, the annealing process may be performed after the active layer 120 is formed.

Referring to FIG. 1 and FIG. 4C, when the material of the active layer 120 is, for example, the metal oxide semiconductor, a problem of current leakage may be resulted in the active layer 120 due to a conductivity change of the metal oxide semiconductor when being exposed to UV light. Besides, the ultraviolet blocking layer 104 formed on the substrate 102 is located between the backlight module 40 and the active layer 120, absorbs the UV light and allows the visible light to pass through. Thus, when incident light emitted from the backlight module 40 is transmitted to the ultraviolet blocking layer 104, the ultraviolet blocking layer 104 absorbs the UV light included in the incident light and allows the visible light included in the incident light to penetrate so as to protect the active layer 120 from damage for being illuminated by the UV light and reduce probability of current leakage of the active layer 120.

Figure 3D:
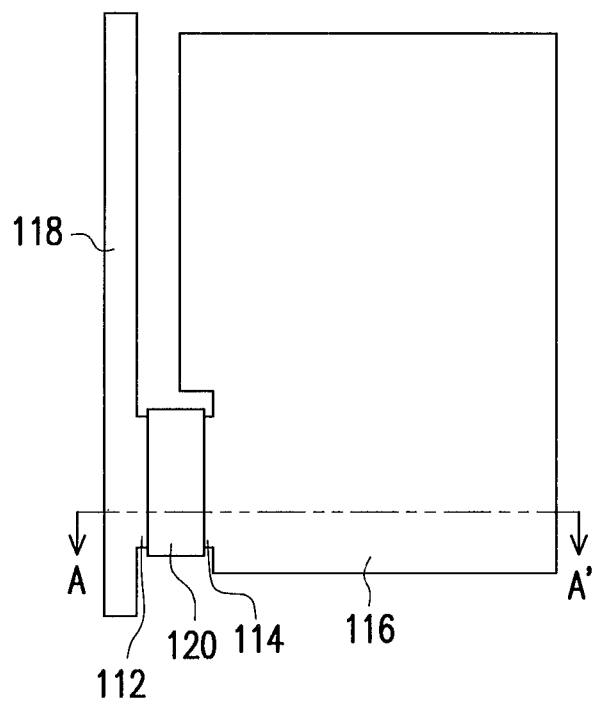
Figure 4D:
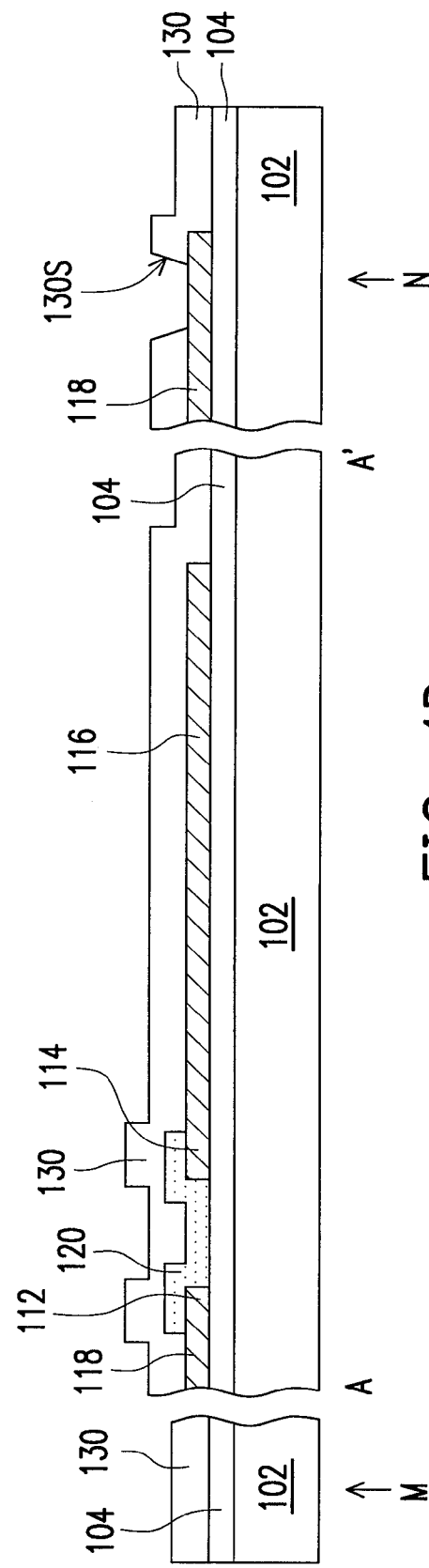

Referring to FIG. 3D and FIG. 4D, an insulating layer 130 is omitted in FIG. 3D. An insulating layer 130 is formed on the substrate 102. The insulating layer 130 covers the active layer 120 and the pixel electrode 116. The insulating layer 130 provides a function of electrical insulation so as to facilitate a fabricating process of a subsequent conductive layer. Next, a third patterning process is performed to form a contact window 130S in the insulating layer 130 of a periphery area 120b. The data line 118 is exposed from the contact window 130S.

Figure 3E:
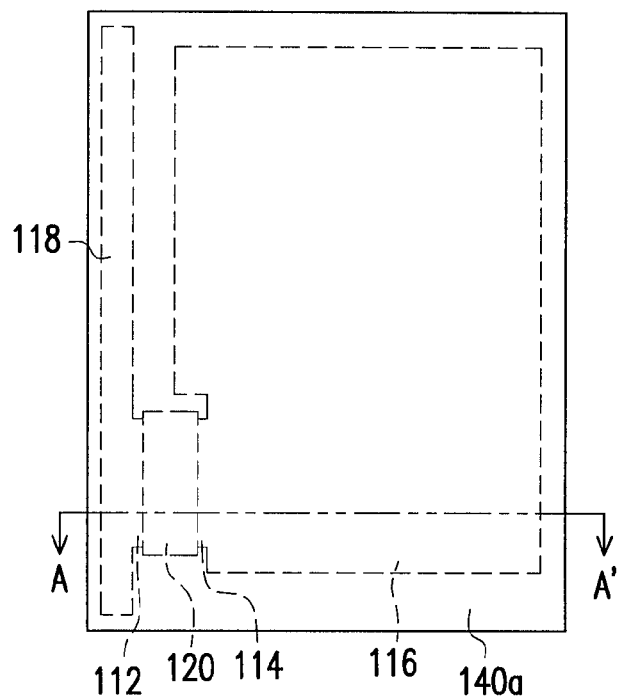

Referring to FIG. 3E and FIG. 4E, a second transparent conductive layer 140 is formed on the insulating layer 130.

Figure 3F:
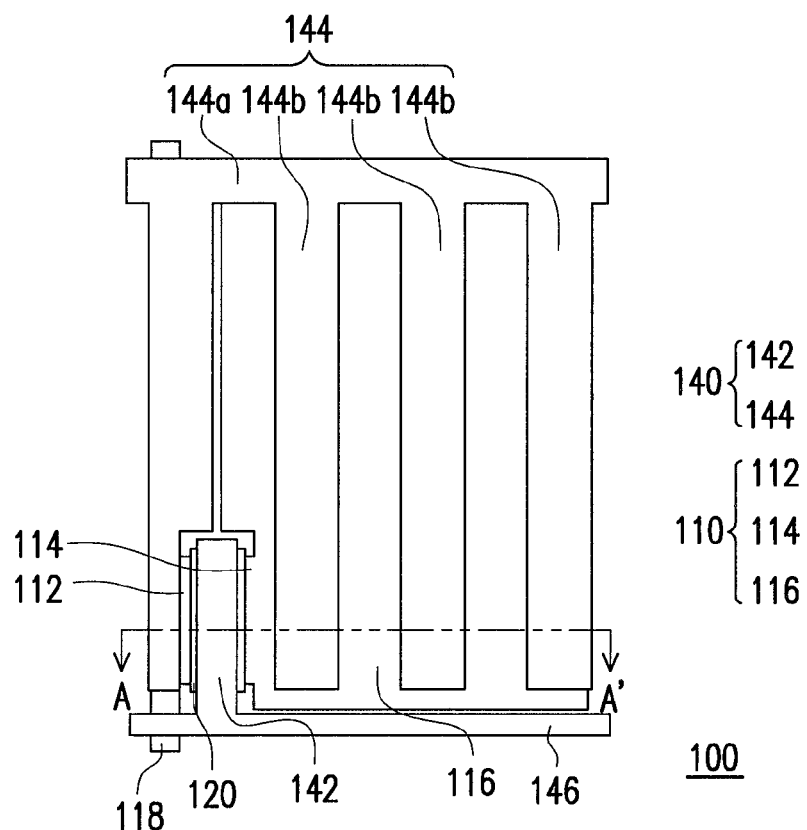

Referring to FIG. 3F and FIG. 4F, a fourth patterning process is performed on the second transparent conductive layer 140a to form a gate 142 and a common electrode 144. The gate 142 is located above the active layer 120, and the common electrode 144 is located above the pixel electrode 116. In the present embodiment, a method of forming the common electrode 144 is, for example, patterning the second transparent conductive layer 140a to form a connection portion 144a and a plurality of strip electrodes 144b that are disposed at intervals. The strip electrodes 144b are connected with the connection portion 144a.

In the present embodiment, the pixel structure 100 includes, for example, a top-gate type thin film transistor, and the gate 142 is, for example, made of a transparent conductive material. Thus, the gate 142 and the common electrode 144 may be fabricated by a same patterning process to simplify the fabricating process and reduce fabrication cost. In addition, the gate 142 and the common electrode 144 are made of the transparent conductive material. Thus, transmittance of the pixel structure 100 can be further improved. Accordingly, the pixel structure 100 may be applied in a transparent display since electrodes and wires in the pixel structure 100 use the transparent conductive material.

Moreover, while forming the gate 142 and the common electrode 144, the scan line 146 and a contact pad 148 are further formed. The scan line 146 is connected with the gate 142, and the scan line 146 extends to the circuit area 102b. The scan line 146 may be further connected with a scan line driving circuit (not shown) to transmit signals to the pixel structure 100. The contact pad 148 is located in the circuit area 102 and on the insulating layer 130, and a portion of the contact pad 148 is filled in the contact window 130S so as to connect the data line 118. The contact pad 148 is, for example, used to connect the data line 118 with a data line driving circuit (not shown) to transmit signals to the pixel structure 100.

Thus, fabrication of the pixel structure 100 is initially completed. In the present embodiment, the pixel structure 100 may be fabricated by four patterning processes. Accordingly, the fabrication method of the pixel structure 100 of the present embodiment can indeed simplify the fabricating process and reduce the fabrication cost.

Figure 3G:
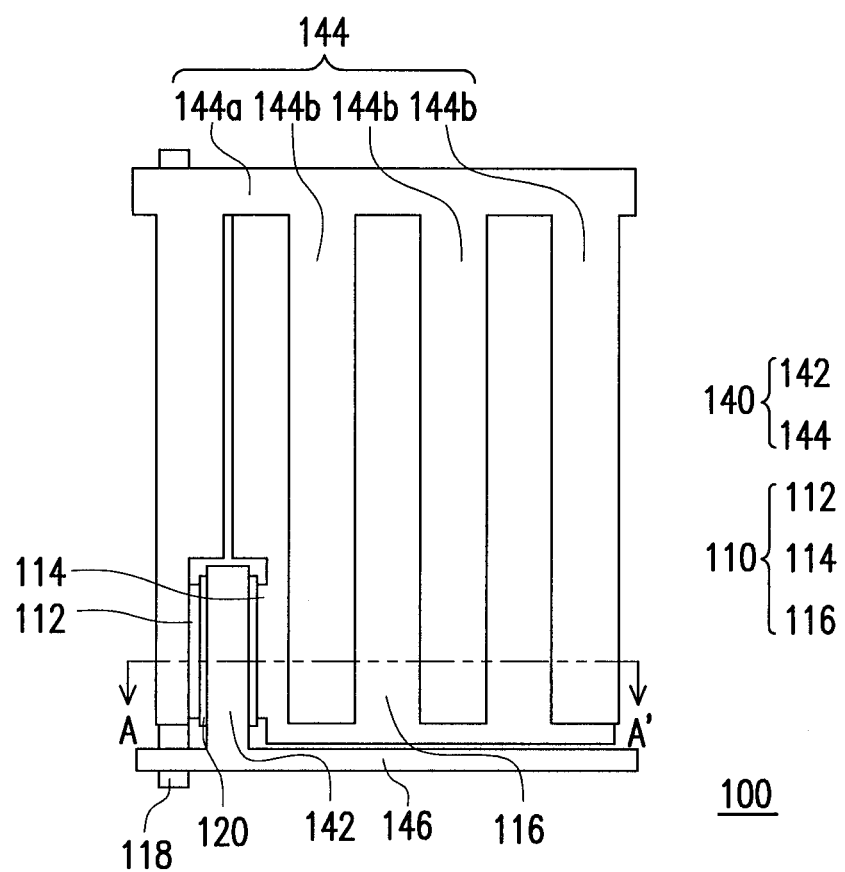
Figure 4G:
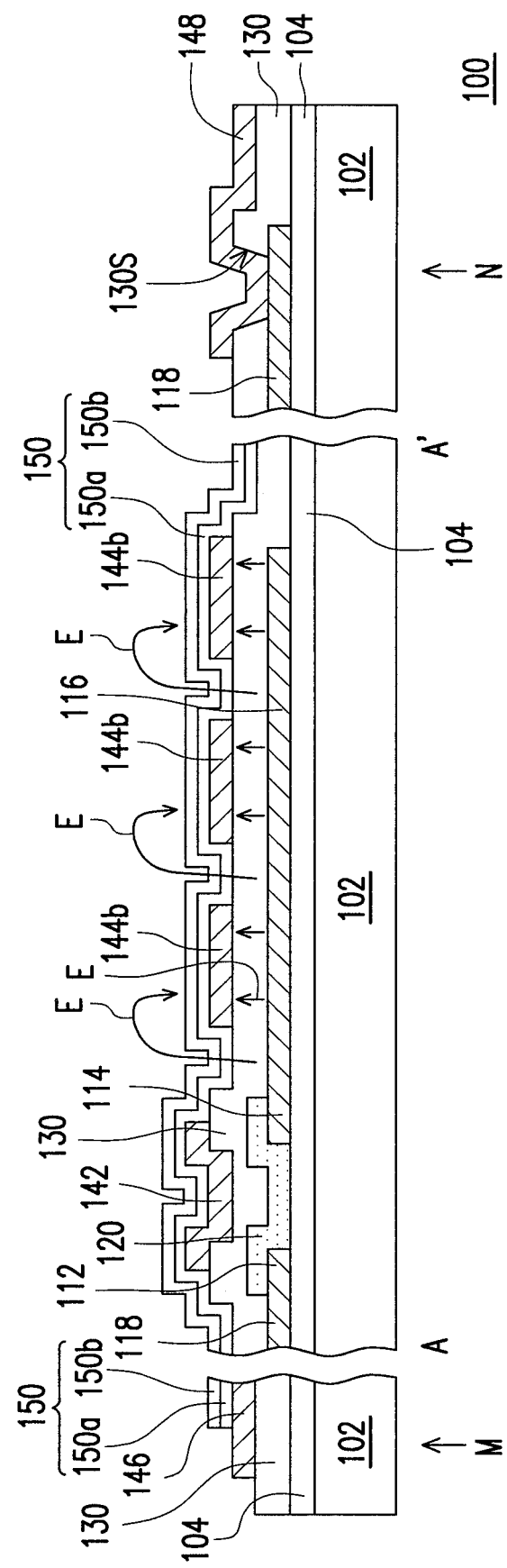

Moreover, referring to FIG. 3G and FIG. 4G, the insulating layer 130 and the protection layer 150 are omitted in FIG. 3G. In order to reduce impact from the environment on components of the pixel structure 100, a protection layer 150 may be further formed on the second patterned transparent conductive layer 140. The step of forming the protection layer 150 is, for example, forming an oxide layer 150a on the gate 142, the common electrode 144 and the insulating layer 130 first and then, forming a nitride layer 150b on the oxide layer 150b. Next, a fifth patterning process is performed to expose the scan line 146 and the contact pad 148 from the circuit area 102b so as to electrically connect the scan line 146 with a scan line driving electrode and electrically connect the data line 118 with the data line driving circuit. Accordingly, the pixel structure 100 may be driven by the scan line 146 and the data line 118 connected with the contact pad 148. However, in another embodiment, the protection layer 150 and the fifth patterning process may be omitted to decrease the number of patterning processes, so that the number of photomasks used in the patterning processes can be further decreased.

In the present embodiment, the nitride layer 150b has good density and thus, can effectively block the water and oxygen. However, during forming the nitride layer 150b, ammonia gas ($NH_3$) may be used in the fabricating process, and nature change of the metal oxide semiconductor used as the active layer 120 may occur due to being interfered by hydrogen ion. Thus, before forming the nitride layer 150b, the oxide layer 150a may be formed to cover the second patterned transparent conductive layer 140, such that the probability of the hydrogen ion infiltrating the active layer 120 during forming the nitride layer 150b may be reduced. Therefore, reliability of the pixel structure 100 can be improved by the protection layer 150, and image sticking occurring in display frames using the pixel structure 100 can be reduced.

Moreover, referring FIG. 3E with FIG. 4E, the pixel structure 100 of the present embodiment is described. The pixel structure 100 includes the first patterned transparent conductive layer 110, the active layer 120, the insulating layer 130 and the second patterned transparent conductive layer 120. The first patterned transparent conductive layer 110 is disposed on the substrate 102 and includes the source 112, the drain 114 and the pixel electrode 116 connected with the drain 114. The active layer 120 is connected with the source 112 and the drain 114. The insulating layer 130 covers the source 112, the drain 114 and the active layer 120. The second patterned transparent conductive layer 140 is disposed on the insulating layer 130 and includes the gate 142 disposed above the active layer 120 and the common electrode 144 disposed above the pixel electrode 116.

It to be mentioned that the common electrode 144 includes the connection portion 144a and the plurality of strip electrodes 144b. The strip electrodes 144b are disposed at intervals and connected with the connection portion 144a. The strip electrodes 144b are located above the pixel electrode 116, and electric field is formed between the strip electrodes 144b and the pixel electrode 116. For example, when the pixel structure 100 is driven, electric field E is generated between the pixel electrode 116 and the strip electrodes 144b. A portion of the electric field E penetrates through a gap between two adjacent strip electrodes 144b. The electric field E penetrating the gap may be used to drive liquid crystal molecules, so that the liquid crystal molecules are rotated in a direction substantially parallel to the substrate 102 to control grayscale for the display screen. Thus, a pixel structure for a fringe field switching liquid crystal display (FFS-LCD) is formed. Additionally, referring to FIG. 4D with FIG. 1, the common electrode 144 of the present embodiment is disposed on the active array substrate 10, and thus, the opposite substrate 20 may not have to be disposed with an electrode.

In light of the foregoing, both the gate and the common electrode of the embodiments of the invention are formed by a transparent conductive layer, and thus, the fabricating process can be simplified for cost down. In addition, in the fabrication method of the pixel structure of the embodiments of the invention, the gate and the common electrode may be fabricated by a same patterning process, so that the number of patterning processes for the pixel structure may be decreased to reduce the fabrication cost.

Although the invention has been described with reference to the above embodiments, it will be apparent to one of the ordinary skill in the art that modifications to the described embodiment may be made without departing from the spirit of the invention. Accordingly, the scope of the invention will be defined by the attached claims not by the above detailed descriptions.

What is claimed is:

1. A pixel structure, comprising:
   a first patterned transparent conductive layer, disposed on a substrate and comprising a source, a drain and a pixel electrode connected with the drain;
   an active layer, connecting the source and the drain, wherein the active layer is in direct contact of at least a portion of a top surface of the source and at least a portion of a top surface of the drain;
   an insulating layer, covering the source, the drain and the active layer;
   a second patterned transparent conductive layer, disposed on the insulating layer and comprising a contact pad, a gate disposed above the active layer and a common electrode disposed above and being substantially overlapped with the pixel electrode, wherein the active layer is located between the gate and the substrate, and the pixel electrode is located between the common electrode and the substrate, wherein the first patterned transparent conductive layer further comprises a data line, the second patterned transparent conductive layer further comprises a scan line, the data line is electrically connected with the source, and the scan line is electrically connected with the gate; and
   a contact window, formed in a periphery area of the insulating layer and exposing a portion of the data line, wherein a portion of the contact pad is filled in the contact window so as to connect the data line.

2. The pixel structure according to claim 1, wherein a material of the active layer comprises a metal oxide semiconductor.

3. The pixel structure according to claim 2, wherein the metal oxide semiconductor comprises indium-gallium-zinc oxide (IGZO), tin oxide, aluminium oxide or a combination thereof.

4. The pixel structure according to claim 1, wherein the pixel structure further comprises an ultraviolet blocking layer disposed between the substrate and the active layer.

5. The pixel structure according to claim 4, wherein a material of the ultraviolet blocking layer comprises silicone resin, acrylic resin or a combination thereof.

6. The pixel structure according to claim 1, wherein the pixel structure further comprises a protection layer covering the second patterned transparent conductive layer and a portion of the insulating layer.

7. The pixel structure according to claim 6, wherein the protection layer comprises an oxide layer and a nitride layer, and the oxide layer is located between the insulating layer and the nitride layer and located between the second patterned transparent conductive layer and the nitride layer.

8. The pixel structure according to claim 1, wherein the common electrode comprises:
- a connection portion; and
- a plurality of strip electrodes disposed at intervals and connected with the connection portion, the plurality of strip electrodes are located above the pixel electrode, wherein a portion of an electric field generated between the pixel electrode and the plurality of strip electrodes penetrates a gap between two adjacent strip electrodes.

* * * * *